US012642025B2

(12) United States Patent
Ghosh et al.

(10) Patent No.: US 12,642,025 B2
(45) Date of Patent: May 26, 2026

(54) LOW TEMPERATURE CARBON GAPFILL WITH REDUCED VOID OR SEAM FORMATION

(71) Applicant: Applied Materials, Inc., Santa Clara, CA (US)

(72) Inventors: Supriya Ghosh, San Jose, CA (US); Susmit Singha Roy, Sunnyvale, CA (US); Abhijit Basu Mallick, Fremont, CA (US); Shuchi Sunil Ojha, Sunnyvale, CA (US); Praket Prakash Jha, San Jose, CA (US); Rui Cheng, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 854 days.

(21) Appl. No.: 17/737,311

(22) Filed: May 5, 2022

(65) Prior Publication Data

US 2023/0360924 A1 Nov. 9, 2023

(51) Int. Cl.
*H10P 50/28* (2026.01)
*H01J 37/32* (2006.01)
*H10P 14/69* (2026.01)

(52) U.S. Cl.
CPC ...... *H10P 50/283* (2026.01); *H01J 37/32449* (2013.01); *H01J 37/32522* (2013.01);
(Continued)

(58) Field of Classification Search
CPC ......... H01L 21/31116; H01L 21/02115; H01L 21/31122; H01L 21/02274;
(Continued)

(56) References Cited

U.S. PATENT DOCUMENTS

| | | | |
|---|---|---|---|
| 2018/0350620 A1* | 12/2018 | Zaitsu | H01L 21/31122 |
| 2019/0385845 A1 | 12/2019 | Manna et al. | |

(Continued)

FOREIGN PATENT DOCUMENTS

| | | |
|---|---|---|
| KR | 20150103227 A | 9/2015 |
| KR | 20210063434 A | 6/2021 |
| TW | 202033810 A | 9/2020 |

OTHER PUBLICATIONS

Application No. PCT/US2023/020652 , International Search Report and Written Opinion, Mailed On Aug. 28, 2023, 9 pages.
(Continued)

*Primary Examiner* — William B Partridge
*Assistant Examiner* — Chevy J Boegel
(74) *Attorney, Agent, or Firm* — Kilpatrick Townsend & Stockton LLP

(57) ABSTRACT

Exemplary methods of semiconductor processing may include providing a carbon-containing precursor to a processing region of a semiconductor processing chamber. A substrate may be disposed within the processing region of the semiconductor processing chamber. The substrate may define one or more features along the substrate. The methods may include forming a plasma of the carbon-containing precursor within the processing region. The methods may include depositing a carbon-containing material on the substrate. The carbon-containing material may extend within the one or more features along the substrate. The methods may include forming a plasma of a hydrogen-containing precursor within the processing region of the semiconductor processing chamber. The methods may include treating the carbon-containing material with plasma effluents of the hydrogen-containing precursor. The plasma effluents of the hydrogen-containing precursor may cause a portion of the
(Continued)

200

Provide carbon-containing precursor — 205

↓

Form plasma of carbon-containing precursor — 210

↓

Deposit carbon-containing material on substrate — 215

↓

Form plasma of hydrogen-containing precursor — 220

↓

Treat carbon-containing material with hydrogen-containing precursor — 225 carbon-containing material to be removed from the substrate.

19 Claims, 3 Drawing Sheets

(52) U.S. Cl.
CPC .... *H01J 37/32844* (2013.01); *H10P 14/6902* (2026.01); *H01J 2237/182* (2013.01); *H01J 2237/2001* (2013.01); *H01J 2237/332* (2013.01); *H01J 2237/334* (2013.01)

(58) Field of Classification Search
CPC ........... H01J 37/32449; H01J 37/32522; H01J 37/32844; H01J 2237/182; H01J 2237/2001; H01J 2237/332; H01J 2237/334

See application file for complete search history.

(56) References Cited

U.S. PATENT DOCUMENTS

| | | | |
|---|---|---|---|
| 2020/0013613 A1 | 1/2020 | Blanquart | |
| 2021/0043444 A1 | 2/2021 | Blanquart | |
| 2021/0151348 A1 | 5/2021 | Utsuno et al. | |
| 2021/0391171 A1* | 12/2021 | Yuan | C23C 16/045 |

OTHER PUBLICATIONS

Korean Application No. 10-2024-7039715 Office Action mailed on Oct. 19, 2025, 9 pages.

\* cited by examiner

200

Provide carbon-containing precursor ~205

Form plasma of carbon-containing precursor ~210

Deposit carbon-containing material on substrate ~215

Form plasma of hydrogen-containing precursor ~220

Treat carbon-containing material with hydrogen-containing precursor ~225

LOW TEMPERATURE CARBON GAPFILL WITH REDUCED VOID OR SEAM FORMATION

TECHNICAL FIELD

The present technology relates to methods and components for semiconductor processing. More specifically, the present technology relates to systems and methods for depositing carbon-containing materials with reduced void or seam formation.

BACKGROUND

Integrated circuits are made possible by processes which produce intricately patterned material layers on substrate surfaces. Producing patterned material on a substrate requires controlled methods for forming and removing material. As device sizes continue to reduce, features within the integrated circuits may get smaller and aspect ratios of structures may grow, and maintaining dimensions of these structures during processing operations may be challenged. Some processing may result in voids or seams in the materials that may result in unwanted or undesirable effects in further processing. Developing materials that can control voids or seams formation may become more difficult as device sizes continue to scale.

Thus, there is a need for improved systems and methods that can be used to produce high quality devices and structures. These and other needs are addressed by the present technology.

SUMMARY

Exemplary methods of semiconductor processing may include providing a carbon-containing precursor to a processing region of a semiconductor processing chamber. A substrate may be disposed within the processing region of the semiconductor processing chamber. The substrate may define one or more features along the substrate. The methods may include forming a plasma of the carbon-containing precursor within the processing region. The methods may include depositing a carbon-containing material on the substrate. The carbon-containing material may extend within the one or more features along the substrate. The methods may include forming a plasma of a hydrogen-containing precursor within the processing region of the semiconductor processing chamber. The methods may include treating the carbon-containing material with plasma effluents of the hydrogen-containing precursor. The plasma effluents of the hydrogen-containing precursor may cause a portion of the carbon-containing material to be removed from the substrate.

In some embodiments, the carbon-containing precursor may be or include acetylene. The plasma of the carbon-containing precursor may be generated at a plasma power of less than or about 500 W. A temperature within the semiconductor processing chamber may be maintained at greater than or about 100° C. to less than or about 500° C. while depositing the carbon-containing material on the substrate and treating the carbon-containing material with plasma effluents of the hydrogen-containing precursor. A pressure within the semiconductor processing chamber may be maintained at less than or about 5 Torr while depositing the carbon-containing material on the substrate and treating the carbon-containing material with plasma effluents of the hydrogen-containing precursor. The plasma of the hydrogen-containing precursor may be generated at a plasma power of greater than a plasma power used to form the plasma of the carbon-containing precursor. Treating the carbon-containing material on the substrate with the plasma effluents of the hydrogen-containing precursor may be performed at a temperature within about 25° C. of the temperature at which the carbon-containing material is formed on the substrate. The methods may include increasing a plasma power within the semiconductor processing chamber prior to treating the carbon-containing material on the substrate with the plasma effluents of the hydrogen-containing precursor. The plasma effluents of the hydrogen-containing precursor may remove a portion of the carbon-containing material overhanging the one or more features, a portion of the carbon-containing material on walls defining the one or more features, or a combination of both. The methods may include sequentially depositing the carbon-containing material on the substrate followed by treating the carbon-containing material with plasma effluents of the hydrogen-containing precursor. The one or more features may iteratively fill higher during each deposition and treatment sequence. Depositing the carbon-containing material and treating the carbon-containing material may be repeated at least three times.

Some embodiments of the present technology may encompass semiconductor processing methods. The methods may include providing a carbon-containing precursor to a processing region of a semiconductor processing chamber. A substrate may be disposed within the processing region of the semiconductor processing chamber. The substrate may define one or more recessed features along the substrate. The methods may include forming a plasma of the carbon-containing precursor within the processing region. The plasma of the carbon-containing precursor may be generated at a first plasma power. The methods may include depositing a carbon-containing material on the substrate. The carbon-containing material may extend within the one or more recessed features along the substrate. The methods may include halting a flow of the carbon-containing precursor. The methods may include providing a hydrogen-containing precursor to the processing region of the semiconductor processing chamber. The methods may include forming a plasma of the hydrogen-containing precursor within the processing region. The plasma of the hydrogen-containing precursor may be generated at a second plasma power. The second plasma power may be greater than the first plasma power. The methods may include treating the carbon-containing material with effluents of a hydrogen-containing plasma. Effluents of the hydrogen-containing plasma may cause a portion of the carbon-containing material to be removed from the substrate.

In some embodiments, the second plasma power may be greater than or about 300 W. The methods may include sequentially depositing the carbon-containing material on the substrate and treating the carbon-containing material with effluents of the hydrogen-containing plasma. Periods of time of depositing the carbon-containing material may be between about 20 s and about 80 s. Periods of time of treating the carbon-containing material with effluents of the hydrogen-containing plasma may be between about 5 s and about 25 s.

Some embodiments of the present technology may encompass semiconductor processing methods. The methods may include providing a carbon-containing precursor to a processing region of a semiconductor processing chamber. The carbon-containing precursor may be or include acetylene. A substrate may be disposed within the processing region of the semiconductor processing chamber. The substrate may define one or more recessed features along the substrate. The methods may include forming a plasma of the carbon-containing precursor within the processing region. The plasma of the carbon-containing precursor may be generated at a plasma power of less than or about 300 W. The methods may include depositing a carbon-containing material on the substrate. The carbon-containing material may extend within the one or more recessed features along the substrate. The methods may include halting a flow of the carbon-containing precursor. The methods may include forming a plasma of a hydrogen-containing precursor within the processing region of the semiconductor processing chamber. The hydrogen-containing precursor may be or include diatomic hydrogen. The methods may include etching a portion of the carbon-containing material with plasma effluents of the hydrogen-containing precursor. A temperature within the processing region may be maintained at less than or about 500° C. A pressure within the processing region may be maintained at less than or about 3 Torr.

In some embodiments, a temperature within the semiconductor processing chamber may be maintained at greater than or about 200° C. to less than or about 400° C. while treating the carbon-containing material on the substrate with the plasma effluents of the hydrogen-containing precursor. A pressure within the semiconductor processing chamber may be maintained at greater than or about 0.3 Torr to less than or about 3 Torr while treating the carbon-containing material on the substrate with the plasma effluents of the hydrogen-containing precursor. The methods may include reducing the pressure within the semiconductor processing chamber prior to treating the carbon-containing material on the substrate with the plasma effluents of the hydrogen-containing precursor. The plasma of the hydrogen-containing precursor may be generated at a plasma power of greater than or about 200 W to less than or about 600 W.

Such technology may provide numerous benefits over conventional systems and techniques. For example, embodiments of the present technology may reduce the void or seam size applicable to a number of substrate features. Additionally, the present technology may produce carbon-containing films for gap filling applications, as well as any other application for which deposited films characterized by a reduced void or seam size may be a benefit. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
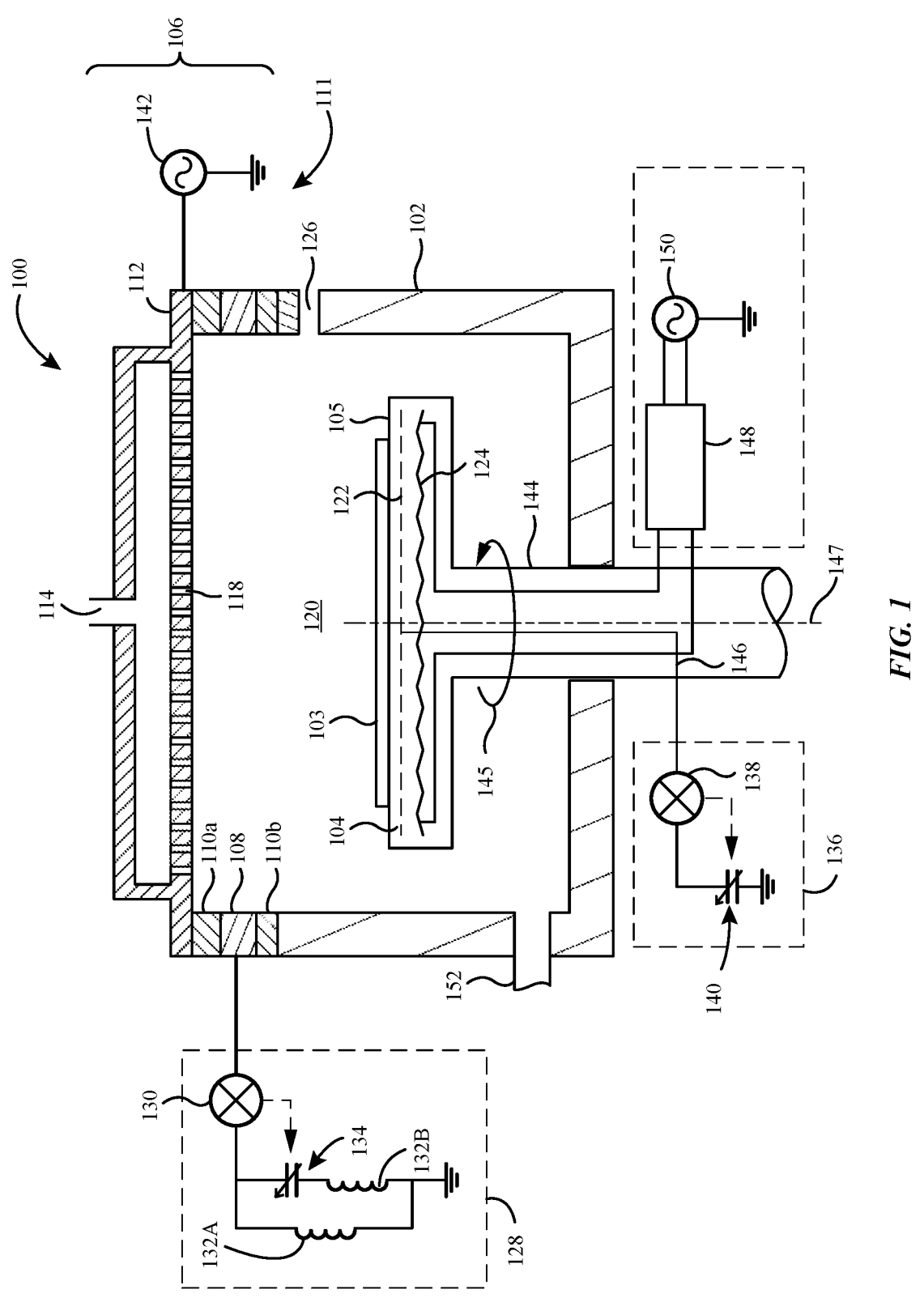
FIG. 1 shows a schematic cross-sectional view of an exemplary plasma system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and size to scale devices. Features across semiconductor structures may be reduced in size, and aspect ratios of the features may increase. As the aspect ratios of the features increase, chemical vapor deposition processes may produce voids or seams within the feature due to pinch off nearer the top of the feature prior to complete fill within the feature.

Conventional technologies, such as reverse tone patterning processes, have struggled to produce films to fill high aspect ratio features in the underlying structures where void or seam formation is controlled. Deposition of carbon-containing materials on the underlying structures containing the high aspect ratio trenches may be incomplete because many carbon-containing film depositions produce conformal films. The fill operation may result in the feature sealing near the top of the feature prior to fill within the feature, which may produce a void in the fill material or a seam up the middle of the feature, which can extend to the top of the structure. In some production, where a polishing operation may subsequently occur, the removal may cause the void or seam to be exposed, which may provide access within the feature. This may allow oxidation of the material once exposed to atmosphere, as well as incorporation of slurry or other materials along the void or seam. Accordingly, many conventional technologies have been limited in the ability to prevent structural flaws in the final devices.

The present technology overcomes these issues by treating a film on the underlying structure to reduce the presence or size of any voids or seams in the film. By treating the film with plasma effluents of a hydrogen-containing gas, the present technology may alter the film on the underlying structure to remove a portion of the film to maintain access to the feature, which allows subsequent deposition of carbon-containing material to gradually fill the feature while minimizing the formation of a void or seam. By filling the features or high aspect ratio structure with carbon-containing material with a reduced or eliminated void or seam, the present technology may prevent problems in any following integration processes and/or defects in the final devices. Although the remaining disclosure will routinely identify specific deposition processes utilizing the disclosed technology, and will describe one type of semiconductor processing chamber, it will be readily understood that the processes described may be performed in any number of semiconductor processing chambers. Accordingly, the technology should not be considered to be so limited as for use with these specific deposition processes or chambers alone. The disclosure will discuss one possible chamber that may be used to perform processes according to embodiments of the present technology before methods of semiconductor processing according to the present technology are described.

FIG. 1 shows a cross-sectional view of an exemplary semiconductor processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The semiconductor processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support 104 during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the semiconductor processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the semiconductor processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the semiconductor processing chamber 100. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the semiconductor processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with the surface 105 of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the semiconductor processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the semiconductor processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support 104. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support 104 may decline. The second electronic controller 140 may have a similar effect, increasing and decreasing aerial coverage of the plasma over the substrate support 104 as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
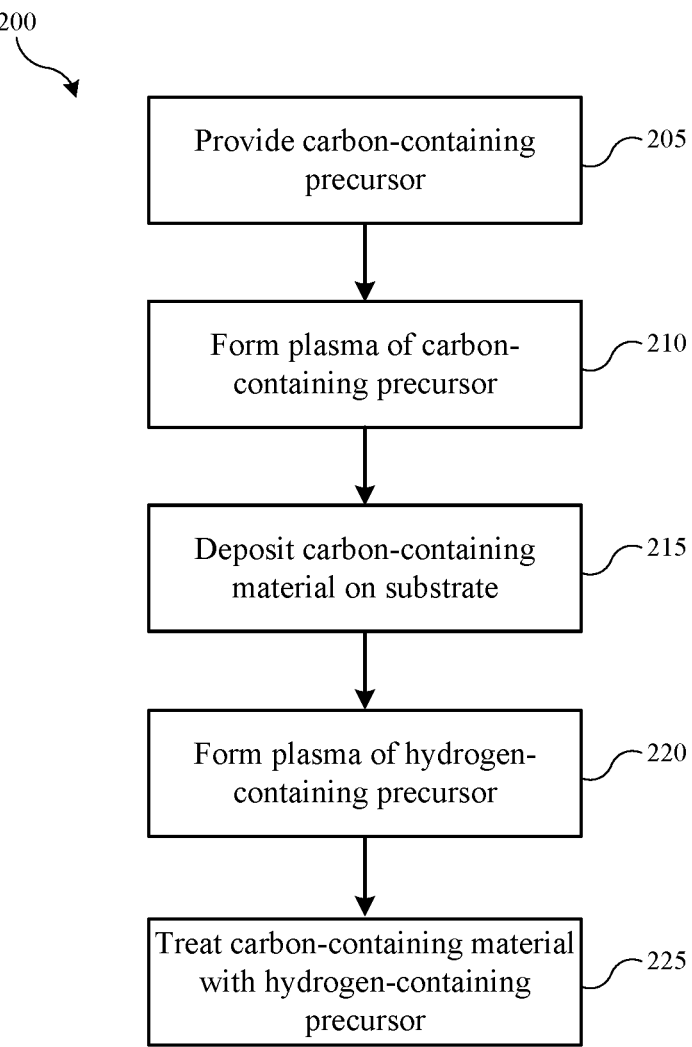
FIG. 2 shows operations in a semiconductor processing method according to some embodiments of the present technology.

FIG. 2 shows exemplary operations in a processing method 200 according to some embodiments of the present technology. The method 200 may be performed in a variety of processing chambers, including the semiconductor processing chamber 100 described above, as well as any other chambers including non-plasma chambers, in which the operations may be performed. Method 200 may include one or more operations prior to the initiation of the method 200, including front-end processing, deposition, etching, polishing, cleaning, or any other operations that may be performed prior to the described operations. The methods 200 may include a number of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below. Method 200 may describe operations shown schematically in FIGS. 3A-3D, the illustrations of which will be described in conjunction with the operations of method 200. It is to be understood that the figures illustrate only partial schematic views, and a substrate may contain any number of additional materials and features having a variety of characteristics and aspects as illustrated in the figures.

Figure 3A:
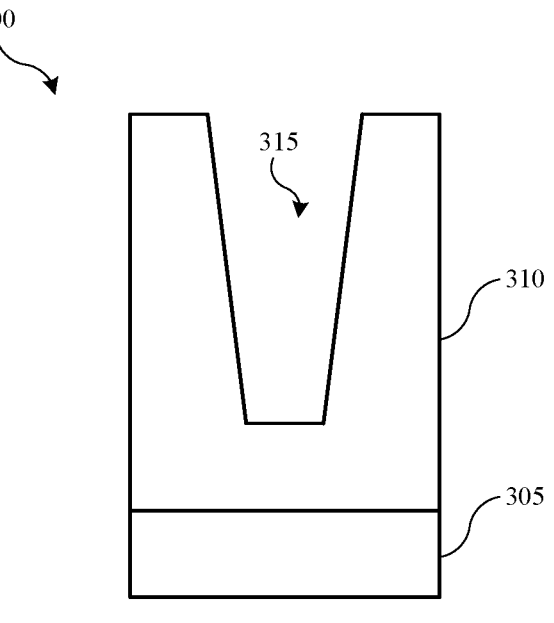
FIGS. 3A-3D show exemplary schematic cross-sectional structures in which material layers are included and produced according to some embodiments of the present technology.

Method 200 may or may not involve optional operations to develop the semiconductor structure to a particular fabrication operation. It is to be understood that method 200 may be performed on any number of semiconductor structures or substrates 305, as illustrated in FIG. 3A, including exemplary structure 300 on which a carbon-containing material may be formed. As illustrated in FIG. 3A substrate 305 may be processed to form one or more features, which may be recessed, such as trenches, apertures, or any other structure in semiconductor processing. Substrate 305 may be any number of materials, such as a base wafer or substrate 305 made of silicon or silicon-containing materials, other substrate 305 materials, as well as one or more materials that may be formed overlying the substrate 305 during semiconductor processing. For example, in some embodiments the substrate 305 may be processed to include one or more materials or structures for semiconductor processing. Substrate 305 may be or include a dielectric material, such as an oxide or nitride of any number of materials. In embodiments, one or more layers of material 310 deposited on the substrate 305. In embodiments, the one or more layers of material 310 may be or include a silicon-containing material. The silicon-containing material may be or include silicon, including amorphous silicon, doped silicon, silicon oxide, silicon nitride, or silicon carbide.

As shown, one or more features 315 may be defined by the one or more layers of material 310 and/or substrate 305, such as a trench, aperture, or other recessed feature. The aspect ratio of the features 315, or the ratio of the depth of the feature relative to the width or diameter of the feature formed, may be greater than or about 1:1, and may be greater than or about 2:1, than or about 3:1, greater than or about 4:1, greater than or about 5:1, greater than or about 6:1, greater than or about 7:1, greater than or about 8:1, greater than or about 9:1, greater than or about 10:1, or more. Although only one feature 315 is shown in the figure, it is to be understood that exemplary structures may have any number of features 315 defined along the structure according to embodiments of the present technology.

At operation 205, the method 200 may include providing a carbon-containing precursor to the processing region of a semiconductor processing chamber, such as semiconductor processing chamber 100, where the substrate 305 may be housed. The semiconductor processing chamber may be the same or a different chamber from the chamber in which a pre-treatment or earlier processing operation may be performed. Carbon-containing precursors that may be used in method 200 may be or include any number of carbon-containing precursors. For example, the carbon-containing precursor may be or include any hydrocarbon, or any material including or consisting of carbon and hydrogen. In some embodiments, the carbon-containing precursor may be characterized by one or more carbon-carbon double bonds and/or one or more carbon-carbon triple bonds. Accordingly, in some embodiments the carbon-containing precursor may be or include an alkane, alkene, or an alkyne, such as acetylene, ethylene, propene, or any other carbon-containing material. The precursor may include carbon-and-hydrogen-containing precursors, which may include any amount of carbon and hydrogen bonding, along with any other element bonding, although in some embodiments the carbon-containing precursor may consist of carbon-to-carbon and carbon-to-hydrogen bonding. In some embodiments, along with the carbon-containing precursor, one or more additional precursors may be delivered, such as a hydrogen-containing precursor, including diatomic hydrogen or any other hydrogen-containing precursor, as well as one or more carrier or inert gases, such as argon or helium, for example.

At operation 210, the method 200 may include forming a plasma of the carbon-containing precursor. Plasma power may impact the depth of carbon penetration, the extent of bond reorientation, and/or the amount of voids 325 and/or seams 330 formation that may occur. Accordingly, in some embodiments the plasma power applied when generating the plasma of carbon-containing precursor, such as the first plasma power applied in method 200, may be less than or about 500 W, and may be less than or about 450 W, less than or about 400 W, less than or about 350 W, less than or about 300 W, less than or about 250 W, less than or about 200 W, less than or about 150 W, less than or about 100 W, or less. However, at lower plasma power the plasma effluents of the carbon-containing precursor may not as readily reach the full depth of the features 315, and thus, in some embodiments, the plasma power may be greater than or about 50 W, greater than or about 75 W, greater than or about 100 W, or more.

Figure 3B:
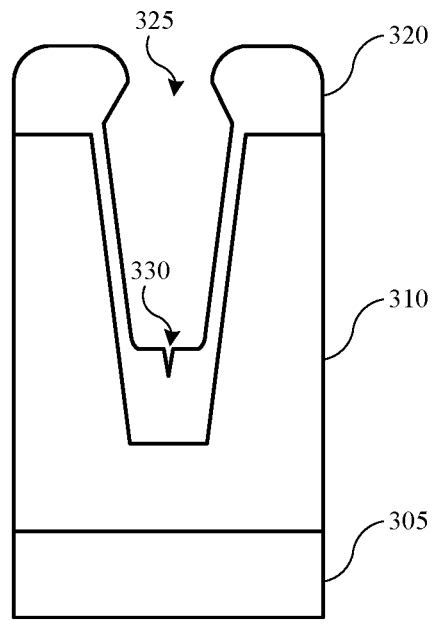

At operation 215, the method 200 may include depositing a layer of carbon-containing material 320 on the substrate 305 and/or one or more layers of material 310. Plasma effluents of the carbon-containing precursor may contact the substrate 305, as well the one or more layers of material 310 if present. As illustrated in FIG. 3B, the carbon-containing layer 320 may extend along any and/or all exposed surfaces along the substrate 305, when exposed, as well as any other incorporated materials, such as the one or more layers of material 310. During operation 215, growth may occur inward within the feature 315 from the sidewalls defining the feature 315. However, the rate of growth inward from the sidewalls may be less than or equal to the rate of growth at the bottom and top of the feature 315.

As will be discussed further herein, a pressure within the semiconductor processing chamber may be maintained at less than or about 5 Torr while depositing the carbon-containing material 320. At pressures less than or about 5 Torr, the plasma effluents of the carbon-containing precursor may be directed toward the bottom of the features 315. Lower pressures, such as less than or about 5 Torr, may result in a longer mean-free path, allowing the plasma effluents of the carbon-containing precursor to more readily reach the bottom of the features 315. Further, carbon-containing material 320 deposited on the sidewalls of the features 315 may be impacted less by the plasma effluents of the carbon-containing precursor due to the directionality of the plasma. This impacting may improve density and film quality during the deposition. Accordingly, by performing the deposition at lower operating pressures, quality may be improved along the bottom of the feature, while lower-quality carbon-containing material may be formed on the sidewalls.

Depositing the carbon-containing material 320 at operation 215 may continue for a sufficient time to deposit an amount of desired carbon-containing material 320 in the feature 315. The time may be dependent on various factors including, but not limited to, depth of the feature 315, aspect ratio of the feature 315, and/or flow rate of the carbon-containing precursor. In some embodiments, periods of time of depositing the carbon-containing material 320 may be greater than or about 10 seconds, and may be greater than or about 20 seconds, greater than or about 30 seconds, greater than or about 40 seconds, greater than or about 50 seconds, greater than or about 60 seconds, greater than or about 70 seconds, greater than or about 80 seconds, greater than or about 90 seconds, greater than or about 100 seconds, or more. However, depending on the feature critical dimension, or width across the feature, increased deposition time of any particular cycle may cause overflow of material across the top of the structure, as illustrated in FIG. 3B. As this continues, the feature may be closed, or the pattern may collapse. Accordingly, in some embodiments the deposition may be performed for less than or about 120 seconds, and may be performed for less than or about 110 seconds, less than or about 100 seconds or less.

The deposition of the carbon-containing material 320 may be substantially conformal, and thus, growth may occur inward within the feature 315 from the sidewalls defining the feature 315 where the rate of growth inward from the sidewalls may be less than or equal to the rate of growth at the bottom and top of the feature 315. The amount of deposition may vary based on the amount of time the deposition of the carbon-containing material 320 is allowed to occur. While the amount of deposition may vary, during the deposition at operation 215, a greater amount of carbon-containing material 320 may be deposited at the bottom of the features 315 than at the top of the features 315. Additionally, in some embodiments, a greater amount of carbon-containing material 320 may be deposited at the bottom and/or top of the features 315 than at the sidewalls defining the features 315.

By performing deposition according to embodiments of the present technology, fill along the bottom of the features 315 may be greater than or equal to about 80% of fill across the top of the features 315, and may be greater than or equal to about 85%, greater than or equal to about 90%, greater than or equal to about 95%, greater than or equal to about 98%, or greater than or equal to about 100%, in which the depth of fill at the bottom of the feature 315 occurs to the same degree as deposition across the top of the features 315, such as between recessed features. Additionally, deposition along the sidewalls of the features 315 relative to deposition either at the bottom of the features 315 or across the top or between features 315 may be limited to a thickness of less than or about 80% of a thickness at the top or bottom of the features 315, and may be limited to a thickness of less than or about 75% of a thickness at the top or bottom of the features 315, less than or about 70% of a thickness at the top or bottom of the features 315, less than or about 65% of a thickness at the top or bottom of the features 315, less than or about 60% of a thickness at the top or bottom of the features 315, less than or about 55% of a thickness at the top or bottom of the features 315, less than or about 50% of a thickness at the top or bottom of the features 315, less than or about 45% of a thickness at the top or bottom of the features 315, less than or about 40% of a thickness at the top or bottom of the features 315, less than or about 35% of a thickness at the top or bottom of the features 315, less than or about 30% of a thickness at the top or bottom of the features 315, less than or about 25% of a thickness at the top or bottom of the features 315, less than or about 20% of a thickness at the top or bottom of the features 315, or less.

This may facilitate removal along the sidewalls, while limiting removal at other locations as will be discussed below.

As the features 315 close, or fill with carbon-containing material 320, voids 325 and/or seams 330 may be formed in the carbon-containing material 320. The void 325 may refer to a portion in the feature 315 between the carbon-containing material 320 deposited on the bottom and top of the feature 315. Voids 325 may form due to an accumulation, or "breadloafing," of carbon-containing material 320 deposited at the top of feature 315. Seams 330 may refer to gaps, or trenches, extending into carbon-containing material 320 at or near the bottom of the feature 315. Although illustrated as a consistent opening in the figure, it is to be understood that void 325 and/or seam 330 structure may additionally be characterized by a number of shapes, which may include top-wide, bottom-wide, as well as a more amorphous shape, as would be readily understood by the skilled artisan. As noted above, at longer deposition times, the amount of deposition at the top of the feature 315 may begin to close off the feature 315 entirely such that the void 325 or seam 330 is formed and is covered by carbon-containing material 320. As it may be desirable to fill the feature 315 entirely while reducing or eliminating any void 325 or seam 330, depositing too much carbon-containing material 320 at once may require removing additional portions of the carbon-containing material 320. Thus, at longer time periods, voids 325 or seams 330 are no longer being filled and portions of the deposited carbon-containing material 320 may need to be removed to continue filling the features 315. The present technology may incorporate removal intervals to maintain access through the feature.

Subsequent to depositing the carbon-containing material 320, the method 200 may include forming a plasma of a hydrogen-containing precursor at operation 220. In some embodiments, the method 200 may include halting a flow of the carbon-containing precursor prior to operation 220. In some embodiments, a flow of the hydrogen-containing precursor may be continued at a similar flow rate as during deposition, or at a higher or lower rate of flow. Additionally, the plasma may be maintained between the deposition and treatment operations by maintaining the flow of the hydrogen-containing precursor and/or the inert or carrier gas. Halting the flow of the carbon-containing precursor may stop deposition, allowing a treatment of the deposited film to be performed. The hydrogen-containing precursor may be provided to the same processing region of the semiconductor processing chamber to treat the carbon-containing material 320, and may be continued from the deposition operation as noted above. In other embodiments, the structure 300 may be moved to a different chamber prior to operation 220. Hydrogen-containing precursors that may be used in method 200 may be or include any number of hydrogen-containing precursors. In embodiments, the hydrogen-containing precursor may be or include diatomic hydrogen.

Plasma power may impact the depth of hydrogen penetration, the etch rate, and/or the amount of void 325 and/or seam 330 removal that may occur. Accordingly, in some embodiments the plasma power applied when generating the plasma of the hydrogen-containing precursor, such as the second plasma power applied in method 200, may be greater than the plasma power utilized during deposition, and may be greater than or about 100 W, greater than or about 150 W, greater than or about 200 W, greater than or about 250 W, greater than or about 300 W, greater than or about 350 W, greater than or about 400 W, greater than or about 450 W, greater than or about 500 W, or more. However, at higher plasma power the bombardment may increase and may cause sputtering or etching of the film at the bottom of the feature as will be discussed further below, and thus, in some embodiments, the plasma power may be less than or about 600 W, less than or about 550 W, less than or about 500 W, less than or about 450 W, less than or about 400 W, or less.

Figure 3C:
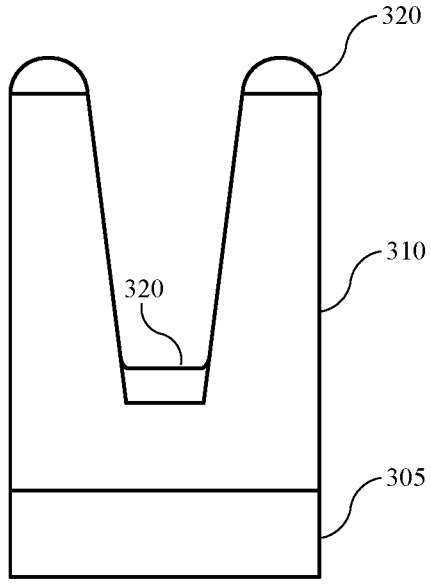

At operation 225 and as illustrated in FIG. 3C, after forming the plasma of the hydrogen-containing material, the method 200 may include treating the carbon-containing material 320 with plasma effluents of the hydrogen-containing precursor. As previously discussed, when depositing the carbon-containing material 320, voids 325 and/or seams 330 may form in the carbon-containing material 320 due to increased sidewall deposition that may close inward, as well as overhang above the features 315. In order to reduce or remove these voids 325 or seams 330, it may be necessary to remove a portion of the carbon-containing material 320 prior to completely filling the feature 315 with carbon-containing material 320. The plasma effluents of the hydrogen-containing precursor may cause a portion of the carbon-containing material 320 to be removed from the substrate 305 and/or one or more layers of material 310 deposited on the substrate 305. Specifically, the plasma effluents of the hydrogen-containing precursor may remove a portion of the carbon-containing material 320 overhanging the features 315, the carbon-containing material 320 on a portion of the carbon-containing material 320 on sidewalls defining the features 315, or a combination of both. Without being bound by any particular theory, the plasma effluents of the hydrogen-containing precursor may be formed and delivered to preferentially remove the lower quality carbon-containing material 320 along sidewalls of the features 315. The hydrogen may effectively reverse the deposition that occurred at operation 215 of this lower quality material by introducing hydrogen that may more readily bond with and revert the carbon-containing material 320. This introduced hydrogen may replace the hydrogen that was removed during the plasma formation of the carbon-containing precursor. With the newly introduced hydrogen, the carbon-containing material 320 may be volatized and more easily removed than the higher quality and densified carbon-containing material 320 at the base of the features 315. Additionally, because the plasma generation may be performed proximate the top of the features 315, ion bombardment may facilitate removal of carbon-containing material 320 at the top of the features 315, while other conditions may be used to control interaction at the bottom of the features 315, such as with pressure as described further below.

Treating the carbon-containing material 320 with plasma effluents of the hydrogen-containing precursor at operation 225 may continue for a sufficient time to remove a desired amount of the carbon-containing material 320 in the feature 315. Similar to operation 215, the time may be dependent on various factors including, but not limited to, depth of the feature 315, aspect ratio of the feature 315, the quality and/or strength of the deposited carbon-containing material 320, and/or a flow rate of the hydrogen-containing precursor. In some embodiments, periods of time of treating the carbon-containing material 320 with plasma effluents of the hydrogen-containing precursor may be greater than or about 5 seconds, and may be greater than or about 7 seconds, greater than or about 9 seconds, greater than or about 11 seconds, greater than or about 13 seconds, greater than or about 15 seconds, greater than or about 17 seconds, greater than or about 19 seconds, or greater. At shorter periods of time, the treatment of the carbon-containing material 320 with plasma effluents of the hydrogen-containing precursor may allow an amount of removal along the sidewalls, which may have deposition to a lower thickness as described above, but may not be sufficient to remove carbon-containing material 320 overhanging the features 315, which may be a higher quality or denser material. Similarly, at longer periods of time, the treatment of the carbon-containing material 320 with plasma effluents of the hydrogen-containing precursor may cause increased removal along the top and bottom of the feature, and may fully remove the higher quality carbon-containing material. Accordingly, in some embodiments the treatment may be performed for less than or about 20 seconds, less than or about 15 seconds, or less.

The amount of removal may vary based on the amount of time the treatment of the carbon-containing material 320 with the plasma effluents of the hydrogen-containing precursor is allowed to occur. While the amount of removal may vary, during the treatment at operation 225, a greater amount of carbon-containing material 320 may be removed from the sidewalls defining the features 315 than at the top of the features 315. Additionally, a greater amount of carbon-containing material 320 may be removed at the top of the features 315 than at the bottom of the features 315. For example, removal along the sidewalls of the features 315 relative to removal either at the bottom of the features 315 or across the top or between features 315 may be greater than or about 20% of a thickness at the top or bottom of the features 315, and may be greater than or about 25% of a thickness at the top or bottom of the features 315, greater than or about 30% of a thickness at the top or bottom of the features 315, greater than or about 35% of a thickness at the top or bottom of the features 315, greater than or about 40% of a thickness at the top or bottom of the features 315, greater than or about 45% of a thickness at the top or bottom of the features 315, greater than or about 50% of a thickness at the top or bottom of the features 315, greater than or about 55% of a thickness at the top or bottom of the features 315, greater than or about 60% of a thickness at the top or bottom of the features 315, greater than or about 65% of a thickness at the top or bottom of the features 315, greater than or about 70% of a thickness at the top or bottom of the features 315, greater than or about 75% of a thickness at the top or bottom of the features 315, greater than or about 80% of a thickness at the top or bottom of the features 315, or more.

To control the etch rate of the carbon-containing material 320 at operation 225, and as will be further discussed herein, the pressure during operation 225 may be maintained at less than or about 5 Torr. As pressure increases, the ion flux may increase, which may increase the etch rate of the carbon-containing material 320, and allow increased etching along the bottom and top of the features 315. In embodiments, it may be desirable to reduce the etch rate as only a portion of the carbon-containing material 320, such as any voids 325 and/or seams 330, may need to be removed. Furthermore, at pressures lower than or about 5 Torr, the etch may be at least partially isotropic, which may remove portions of the carbon-containing material 320 overhanging the features 315 or deposited on the sidewalls defining the features 315 preferentially over carbon-containing material 320 deposited at the bottom of the features 315.

Figure 3D:
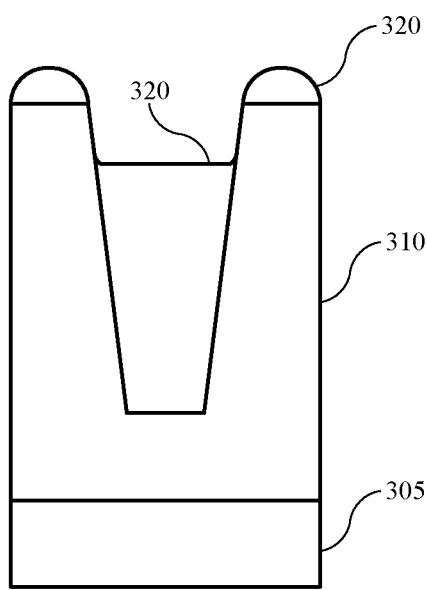

As illustrated in FIG. 3D, in order to fill the features 315 while reducing or eliminating the voids 325 and/or seams 330, the method 200 may include sequentially depositing the carbon-containing material 320, such as on the substrate 305, followed by treating the carbon-containing material 320 with plasma effluents of the hydrogen-containing precursor. This process may be repeated for any number of cycles. When cycling the deposition and etching of the carbon-containing material 320, the one or more features 315 may iteratively fill higher in a bottom up gapfill, such as towards the top of the feature 315, during each deposition and treatment sequence. As previously discussed, treating the carbon-containing material 320 with plasma effluents of the hydrogen-containing precursor may etch a portion of the carbon-containing material 320. The portion of carbon-containing material 320 etched by the plasma effluents of the hydrogen-containing precursor may be lesser quality carbon-containing material 320. This lesser quality carbon-containing material 320 may be deposited on the walls defining the features 315, overhanging the features 315, or proximate seams 330 formed in the carbon-containing material 320. The carbon-containing material 320 deposited on the walls defining the features 315, overhanging the features 315, or proximate seams 330 may be lesser quality due to lesser bombardment and/or interaction during deposition. By repeatedly depositing and treating the carbon-containing material 320, voids 325 and/or seams 330 may be reduced or eliminated entirely.

The number of iterations of sequentially depositing film and treating the film may be dependent on a variety of factors including, but not limited to, the depth of the features 315, the aspect ratio of the features 315, the quality of the deposited carbon-containing material 320, and/or the presence of voids 325 and/or seams 330 in the carbon-containing material 320. In some embodiments, the method 200 may include depositing the carbon-containing material 320 and treating the carbon-containing material 320 may be repeated at least three times, and may include depositing and treating the carbon-containing material 320 at least four times, at least five times, at least six times, at least seven times, or more.

During any operation of the method 200, the semiconductor processing chamber, the pedestal, or the substrate 305 may be maintained at a variety of temperatures at which film depositions and/or etching treatments may be performed. In some embodiments the temperature of the semiconductor processing chamber, the pedestal, or the substrate 305 may be maintained at less than or about 500° C., less than or about 450° C., less than or about 400° C., less than or about 350° C., less than or about 300° C., or less. In embodiments, the temperature of the semiconductor processing chamber, the pedestal, or the substrate 305 may be maintained at greater than or about 100° C., greater than or about 150° C., greater than or about 200° C., greater than or about 250° C., greater than or about 300° C., or more. In some embodiments, the temperature during the deposition of the carbon-containing material 320 on the substrate 305 at operation 215 and the treatment of the carbon-containing material 320 with the hydrogen-containing precursor at operation 225 may be performed at nearly the same temperature. In some embodiments, treating the carbon-containing material 320 with the plasma effluents of the hydrogen-containing precursor may be performed at a temperature within about 25° C. of the temperature at which the carbon-containing material 320 is formed on the substrate 305, and may be performed at a temperature within about 20° C., within about 15° C., within about 10° C., within about 5° C., or less.

At operation 220, the semiconductor processing chamber may be maintained at a variety of pressures at which deposition may be performed. Additionally, in some embodiments the pressure may be adjusted subsequent film deposition, such as during the hydrogen treatment. For example, a pressure within the semiconductor processing chamber may be maintained at greater than or about 0.1 Torr while depositing the carbon-containing material 320, such as on the substrate 305, and treating the carbon-containing material 320 with plasma effluents of the hydrogen-containing precursor, and may be maintained at greater than or about 0.1 Torr, greater than or about 0.3 Torr, greater than or about 0.5 Torr, greater than or about 1 Torr, greater than or about 2 Torr, greater than or about 3 Torr, greater than or about 4 Torr, or more. Similarly, the a pressure within the semiconductor processing chamber may be maintained at less than or about 5 Torr while depositing the carbon-containing material 320, such as on the substrate 305, and treating the carbon-containing material 320 with plasma effluents of the hydrogen-containing precursor, and may be maintained at less than or about 4 Torr, less than or about 3 Torr, less than or about 2 Torr, less than or about 1 Torr, or less.

In some embodiments, the method 200 may include reducing the pressure within the semiconductor processing chamber prior to treating the carbon-containing material 320 on the substrate 305 with the plasma effluents of the hydrogen-containing precursor at operation 225. As previously discussed, at pressures lower than or about 5 Torr, the etch may be at least partially isotropic and ion flux may be reduced, which may remove portions of the carbon-containing material 320 overhanging the features 315 or deposited on the walls defining the features 315, while limiting removal along the base of the feature.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a carbon-containing precursor" includes a plurality of such precursors, and reference to "the carbon-containing material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing a carbon-containing precursor to a processing region of a semiconductor processing chamber, wherein a substrate is disposed within the processing region of the semiconductor processing chamber, and wherein the substrate defines one or more features along the substrate;
forming a plasma of the carbon-containing precursor within the processing region, the plasma of the carbon-containing precursor is generated at a plasma power of less than or about 500 W;
depositing a carbon-containing material on the substrate, wherein the carbon-containing material extends within the one or more features along the substrate;
forming a plasma of a hydrogen-containing precursor within the processing region of the semiconductor processing chamber; and
treating the carbon-containing material with plasma effluents of the hydrogen-containing precursor, wherein the plasma effluents of the hydrogen-containing precursor cause a portion of the carbon-containing material to be removed from the substrate.

2. The semiconductor processing method of claim 1, wherein:
the carbon-containing precursor comprises acetylene.

3. The semiconductor processing method of claim 1, wherein:
a temperature within the semiconductor processing chamber is maintained at greater than or about 100° C. to less than or about 500° C. while depositing the carbon-containing material on the substrate and treating the carbon-containing material with plasma effluents of the hydrogen-containing precursor.

4. The semiconductor processing method of claim 1, wherein:
a pressure within the semiconductor processing chamber is maintained at less than or about 5 Torr while depositing the carbon-containing material on the substrate and treating the carbon-containing material with plasma effluents of the hydrogen-containing precursor.

5. The semiconductor processing method of claim 1, wherein:
the plasma of the hydrogen-containing precursor is generated at a plasma power of greater than a plasma power used to form the plasma of the carbon-containing precursor.

6. The semiconductor processing method of claim 1, wherein:
treating the carbon-containing material on the substrate with the plasma effluents of the hydrogen-containing precursor is performed at a temperature within about 25° C. of the temperature at which the carbon-containing material is formed on the substrate.

7. The semiconductor processing method of claim 1, further comprising:
increasing a plasma power within the semiconductor processing chamber prior to treating the carbon-containing material on the substrate with the plasma effluents of the hydrogen-containing precursor.

US 12,642,025 B2

17

8. The semiconductor processing method of claim 1, wherein:
the plasma effluents of the hydrogen-containing precursor remove a portion of the carbon-containing material overhanging the one or more features, a portion of the carbon-containing material on walls defining the one or more features, or a combination of both.

9. The semiconductor processing method of claim 1, further comprising:
sequentially depositing the carbon-containing material on the substrate followed by treating the carbon-containing material with plasma effluents of the hydrogen-containing precursor, wherein the one or more features iteratively fill higher during each deposition and treatment sequence.

10. The semiconductor processing method of claim 9, wherein:
depositing the carbon-containing material and treating the carbon-containing material is repeated at least three times.

11. A semiconductor processing method comprising:
providing a carbon-containing precursor to a processing region of a semiconductor processing chamber, wherein a substrate is disposed within the processing region of the semiconductor processing chamber, and wherein the substrate defines one or more recessed features along the substrate;
forming a plasma of the carbon-containing precursor within the processing region, wherein the plasma of the carbon-containing precursor is generated at a first plasma power;
depositing a carbon-containing material on the substrate, wherein the carbon-containing material extends within the one or more recessed features along the substrate;
halting a flow of the carbon-containing precursor;
providing a hydrogen-containing precursor to the processing region of the semiconductor processing chamber;
forming a plasma of the hydrogen-containing precursor within the processing region, wherein the plasma of the hydrogen-containing precursor is generated at a second plasma power, and wherein the second plasma power is greater than the first plasma power; and
treating the carbon-containing material with effluents of a hydrogen-containing plasma, wherein effluents of the hydrogen-containing plasma cause a portion of the carbon-containing material to be removed from the substrate.

12. The semiconductor processing method of claim 11, wherein:
the second plasma power is greater than or about 300 W.

13. The semiconductor processing method of claim 11, further comprising:
sequentially depositing the carbon-containing material on the substrate and treating the carbon-containing material with effluents of the hydrogen-containing plasma.

14. The semiconductor processing method of claim 13, wherein:
periods of time of depositing the carbon-containing material are between about 20 s and about 80 s; and
periods of time of treating the carbon-containing material with effluents of the hydrogen-containing plasma are between about 5 s and about 25 s.

15. A semiconductor processing method comprising:
providing a carbon-containing precursor to a processing region of a semiconductor processing chamber, wherein the carbon-containing precursor comprises acetylene, wherein a substrate is disposed within the processing region of the semiconductor processing chamber, and wherein the substrate defines one or more recessed features along the substrate;
forming a plasma of the carbon-containing precursor within the processing region, wherein the plasma of the carbon-containing precursor is generated at a plasma power of less than or about 300 W;
depositing a carbon-containing material on the substrate, wherein the carbon-containing material extends within the one or more recessed features along the substrate;
halting a flow of the carbon-containing precursor;
forming a plasma of a hydrogen-containing precursor within the processing region of the semiconductor processing chamber, wherein the hydrogen-containing precursor comprises diatomic hydrogen; and
etching a portion of the carbon-containing material with plasma effluents of the hydrogen-containing precursor;
wherein a temperature within the processing region is maintained at less than or about 500° C., and a pressure within the processing region is maintained at less than or about 3 Torr.

16. The semiconductor processing method of claim 15, wherein:
a temperature within the semiconductor processing chamber is maintained at greater than or about 200° C. to less than or about 400° C. while treating the carbon-containing material on the substrate with the plasma effluents of the hydrogen-containing precursor.

17. The semiconductor processing method of claim 15, wherein:
a pressure within the semiconductor processing chamber is maintained at greater than or about 0.3 Torr to less than or about 3 Torr while treating the carbon-containing material on the substrate with the plasma effluents of the hydrogen-containing precursor.

18. The semiconductor processing method of claim 15, further comprising:
reducing the pressure within the semiconductor processing chamber prior to treating the carbon-containing material on the substrate with the plasma effluents of the hydrogen-containing precursor.

19. The semiconductor processing method of claim 15, wherein:
the plasma of the hydrogen-containing precursor is generated at a plasma power of greater than or about 200 W to less than or about 600 W.

* * * * *